United States Patent
Ikeda et al.

(10) Patent No.: US 10,461,234 B2
(45) Date of Patent: Oct. 29, 2019

(54) METAL-BASE SUBSTRATE, SEMICONDUCTOR DEVICE AND METHOD FOR MANUFACTURING THE SAME

(71) Applicant: NICHIA CORPORATION, Anan-shi, Tokushima (JP)

(72) Inventors: Tomohiro Ikeda, Komatsushima (JP); Masaaki Katsumata, Anan (JP); Yohei Inayoshi, Komatsushima (JP); Yosuke Nakayama, Komatsushima (JP); Yumiko Kameshima, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 52 days.

(21) Appl. No.: 15/699,289

(22) Filed: Sep. 8, 2017

(65) Prior Publication Data

US 2018/0090654 A1    Mar. 29, 2018

(30) Foreign Application Priority Data

Sep. 29, 2016   (JP) ................. 2016-192188

(51) Int. Cl.
| | | |
|---|---|---|
| H01L 21/02 | (2006.01) | |
| H01L 33/64 | (2010.01) | |
| H01L 25/075 | (2006.01) | |
| H01L 33/62 | (2010.01) | |
| H05K 1/18 | (2006.01) | |
| H05K 3/00 | (2006.01) | |

(52) U.S. Cl.
CPC ........ *H01L 33/647* (2013.01); *H01L 25/0753* (2013.01); *H01L 33/62* (2013.01); *H01L 33/64* (2013.01); *H01L 2224/16225* (2013.01); *H01L 2224/48091* (2013.01); *H01L 2224/48137* (2013.01); *H01L 2933/0075* (2013.01); *H05K 1/189* (2013.01); *H05K 3/0061* (2013.01); *H05K 2201/10106* (2013.01)

(58) Field of Classification Search
CPC ........ H01L 21/02304; H01L 21/02005; H01L 21/02008; H01L 21/0201; H01L 21/02016
See application file for complete search history.

(56) References Cited

U.S. PATENT DOCUMENTS

| | | | |
|---|---|---|---|
| 8,707,551 | B2 | 4/2014 | Amey et al. |
| 2009/0136725 | A1 | 5/2009 | Shimokawa et al. |
| 2013/0062656 | A1* | 3/2013 | Lee .................... H01L 25/0753 |
| | | | 257/99 |
| 2014/0327024 | A1 | 11/2014 | Ishihara et al. |
| 2015/0155459 | A1 | 6/2015 | Ishihara et al. |
| 2015/0251397 | A1 | 9/2015 | Lee |

FOREIGN PATENT DOCUMENTS

| | | |
|---|---|---|
| JP | 05-018839 A | 1/1993 |
| JP | 06-045715 A | 2/1994 |
| JP | 10-323786 A | 12/1998 |

(Continued)

*Primary Examiner* — Jae Lee

(74) *Attorney, Agent, or Firm* — Global IP Counselors, LLP

(57) ABSTRACT

A method for manufacturing a metal-base substrate includes: preparing a film substrate by forming a wiring layer on a first surface of the film substrate; and sticking a metal plate on a second surface of the film substrate opposite from the first surface, with an adhesive layer being interposed between the metal plate and the film substrate.

17 Claims, 14 Drawing Sheets

(56) References Cited

FOREIGN PATENT DOCUMENTS

| | | | |
|---|---|---|---|
| JP | 2003-071982 | A | 3/2003 |
| JP | 2005-305729 | A | 11/2005 |
| JP | 2009-212171 | A | 9/2009 |
| JP | 2011-507235 | A | 3/2011 |
| JP | 2012-049486 | A | 3/2012 |
| JP | 2012-109521 | A | 6/2012 |
| JP | 2012-124453 | A | 6/2012 |
| JP | 2014-179410 | A | 9/2014 |
| JP | 2015-168262 | A | 9/2015 |
| WO | 2007-111268 | A1 | 10/2007 |
| WO | 2009-073670 | A1 | 6/2009 |
| WO | 2013-018783 | A1 | 2/2013 |

\* cited by examiner

A: FILM SUBSTRATE MANUFACTURING STEPS
B: METAL-BASE SUBSTRATE MANUFACTURING STEPS

A

METAL-BASE SUBSTRATE, SEMICONDUCTOR DEVICE AND METHOD FOR MANUFACTURING THE SAME

CROSS-REFERENCE TO RELATED APPLICATIONS

This application claims priority to Japanese Patent Application No. 2016-192188, filed on Sep. 29, 2016. The entire disclosure of Japanese Patent Application No. 2016-192188 is hereby incorporated by reference.

TECHNICAL FIELD

The present disclosure relates to a manufacturing method for a metal-base substrate, a manufacturing method for a semiconductor device, a metal-base substrate, and a semiconductor device using the same.

BACKGROUND

To lower the temperature due to heat generated from a light emitting element such as an LED or the like, and to give sufficient durability for practical use, high heat dissipation characteristics are required for circuit boards on which light emitting elements are mounted. The required heat dissipation characteristics differ according to the light emitting efficiency of the light emitting elements, the input power, and the mounting density, but with high mounting density applications, a metal-base high heat dissipation substrate that performs heat dissipation through a metal plate in a form insulated from electrical circuits is generally used.

For example, Japanese Laid-Open Patent Application (translation of PCT application) No. 2011-507235 discloses a laminate and a flexible substrate structure, the laminate including a copper or aluminum metal layer, a polyimide layer or adhesive agent layer adjacent to the metal layer, a copper thin layer, and a liquid or film solder mask layer. Also, Japanese Laid-Open Patent Publication No. 2003-071982 discloses a thermal countermeasure copper clad plate for which a thin-layer polyimide, having imide units with a specific chemical structure, is laminated and integrated on both surfaces of a low thermal expansion substrate polyimide layer, and for which copper foil is laminated on one surface of a multilayer polyimide film, and a metal plate or ceramic plate with good heat transference is laminated on the other surface.

SUMMARY

According to one aspect of the present invention, a method for manufacturing a metal-base substrate includes: preparing a film substrate by forming a wiring layer on a first surface of the film substrate; and sticking a metal plate on a second surface of the film substrate opposite from the first surface, with an adhesive layer being interposed between the metal plate and the film substrate.

According to another aspect of the present invention, a method for manufacturing a semiconductor device includes placing a semiconductor element on the metal-base substrate manufactured using the method for manufacturing a metal-base substrate noted above.

According to further aspect of the present invention, a metal-base substrate has a metal plate, an adhesive layer, and a film substrate having a wiring layer on a first surface opposite to a second surface on which the adhesive layer is arranged, with a through hole piercing through the film substrate in a thickness direction of the film substrate.

According to further aspect of the present invention, a metal-base substrate has a metal plate, an adhesive layer, and a film substrate having a wiring layer on a first surface opposite to a second surface on which the adhesive layer is arranged, with a through hole piercing through the film substrate and the adhesive layer in a thickness direction of the film substrate and the adhesive layer.

According to further aspect of the present invention, a semiconductor device has a semiconductor element placed on the metal-base substrate noted above.

BRIEF DESCRIPTION OF THE DRAWINGS

The disclosure will become more fully understood from the following detailed description, taken in conjunction with the accompanying figures, in which.

DETAIL DESCRIPTION OF EMBODIMENTS

Embodiments

Figure 1A:
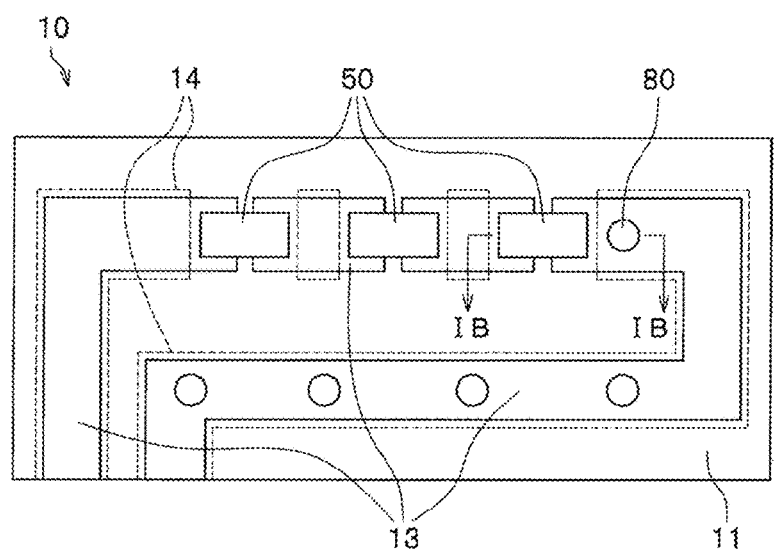
FIG. 1A is a plan view schematically showing the configuration of the light emitting device of a first embodiment.

Embodiments are described hereafter while referring to the drawings. Note that the modes shown hereafter show examples of a film substrate, a metal-base substrate, and a semiconductor device for embodying the technical concepts of the present embodiments, and the present invention is not limited to the following. Also, the dimensions, materials, shapes, and relative arrangement, etc. of the component parts noted in the embodiments, unless specifically noted, are nothing more than explanatory examples, and do not limit the scope of the present invention only to those. The size and positional relationship, etc. of the members shown in each drawing may be exaggerated to clarify an explanation. Also, with the explanation hereafter, the same name and code number indicates a member that is the same or has the same properties, and detailed explanations are omitted as appropriate.

First Embodiment

Film Substrate, Metal-Base Substrate, and Semiconductor Device

First, a film substrate, a metal-base substrate, and a semiconductor device of a first embodiment will be described. The semiconductor device of the present embodiment is a semiconductor light emitting device (hereafter also called "light emitting device") that uses a semiconductor light emitting element (hereafter also called "light emitting element") as a semiconductor element.

Figure 1B:
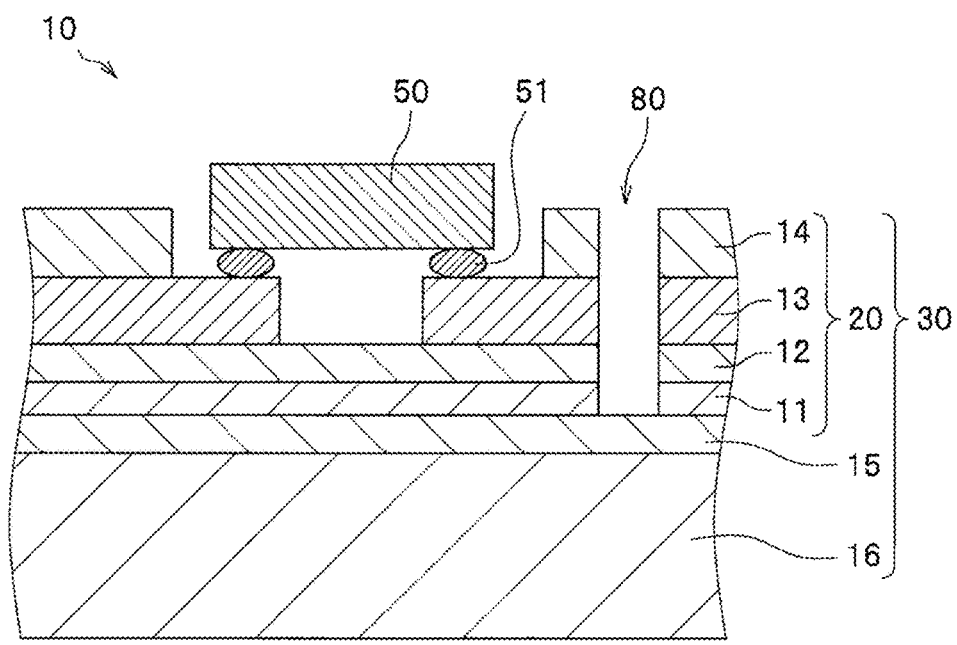
FIG. 1B is a cross section view schematically showing the configuration of the light emitting device of the first embodiment, showing the cross section of line IB-IB in FIG. 1A.

FIG. 1A is a plan view schematically showing the configuration of the light emitting device of the first embodiment. FIG. 1B is a cross section view schematically showing the configuration of the light emitting device of the first embodiment, showing the cross section of line IB-IB in FIG. 1A. In FIG. 1A, the protective layer 14 is shown only in the external form with a dotted line, illustrating a transparent state, and the adhesive layer 12 for a wiring layer 13 is not illustrated.

A light emitting device 10 is provided with a metal-base substrate 30 provided with a film substrate 20; and light emitting elements 50 placed on the metal-base substrate 30. First, after describing the film substrate 20 and the metal-base substrate 30 that constitute the light emitting device 10, the light emitting device 10 will be described.

Film Substrate

The film substrate 20 is provided with a film 11; an adhesive layer 12 for a wiring layer 13 provided on the film 11; a wiring layer 13 that is pattern-formed on the film 11, with the adhesive layer 12 for a wiring layer 13 interposed; and a protective layer 14 provided at a prescribed position on the wiring layer 13.

The film 11 is a member that becomes a base for the wiring layer 13 and the protective layer 14, and is a member for insulating the wiring layer 13 and the metal plate 16. As the film 11, it is possible to use various types of resin film material such as polyimide, polyamide, polyphenylene sulfide, liquid crystal polymer, fluororesin or the like. The film 11 preferably has a thickness of 5 µm to 50 µm to establish both insulation and thermal conductivity.

The adhesive layer 12 for a wiring layer 13 is an adhesive layer for connecting the film 11 and the wiring layer 13. As the adhesive layer 12 for a wiring layer 13, it is possible to use various types of resin materials, such as epoxy type, silicone type, polyimide type, polyester type, acrylic type, urethane type, phenol type, or a composite of these. The adhesive layer 12 for a wiring layer 13 preferably has a thickness of 20 μm or less for thermal conductivity.

The wiring layer 13 is for electrically connecting the light emitting elements 50 and an external power supply, and applying voltage from the external power supply to the light emitting elements 50. The wiring layer 13 is pattern-formed on the film 11 with the adhesive layer 12 for a wiring layer 13 interposed, forming electrical circuits. As examples of the wiring layer 13, copper foil, aluminum foil and the like can be listed. For the thickness of the wiring layer 13, it is possible to use an item of 1 μm to 200 μm, with 5 μm to 100 μm being preferable, and 18 μm to 70 μm being especially preferable.

The protective layer 14 is an insulating film for covering a portion of the surface of the wiring layer 13, and functions as a protective film for the wiring layer 13. The protective layer 14 is provided at a site excluding the mounting area of the light emitting elements 50 on the wiring layer 13. The protective layer 14 is provided on the adhesive layer 12 for a wiring layer 13 positioned at the side surface of the wiring layer 13, excluding the mounting area of the light emitting elements 50, and covers the side surface of the wiring layer 13. For the protective layer 14, it is possible to use an epoxy type or silicone type resin or the like containing a light diffusing material such as titanium oxide.

The film 11, the adhesive layer 12 for a wiring layer 13, and the protective layer 14 are respectively preferably selected with resistance to the process temperature for mounting the light emitting elements 50, to the temperature when using the light emitting device 10, and to temperature related degradation.

The film substrate 20 is provided with a plurality of through holes 80 that pierce through the substrate in the thickness direction. By the film substrate 20 having the through holes 80, as is described hereafter, when manufacturing the metal-base substrate 30, it is easier to remove bubbles that form between the film substrate 20 and the metal plate 16.

In the configuration of the light emitting device 10, in this example, five through holes 80 are provided. The number of through holes 80 is not particularly limited provided there are one or more in the light emitting device 10 configuration.

The through holes 80 are formed in a part of the film substrate 20 having the wiring layer 13. Here, the through holes 80 are formed on the ground part of the wiring layer 13. By forming the through holes 80 in the ground part, even if migration occurs, short circuit defects will not occur.

Also, the through holes 80 are not affected by the current flowing in the wiring layer 13, and are formed so as not to lose the wiring layer 13 function.

The diameter of the through holes 80 is preferably 30 μm or greater. If the diameter is 30 μm or greater, bubbles are more easily removed. It is more preferably 100 μm or greater. For example, when the size of the film 11 is vertically 100 mm×horizontally 100 mm, the diameter of the through holes 80 can be 5 mm or less, for example.

Metal-Base Substrate

The metal-base substrate 30 is provided with the previously described film substrate 20 which is provided with the film 11, the adhesive layer 12 for a wiring layer 13, the wiring layer 13, and the protective layer 14.

The metal-base substrate 30 is provided with the film substrate 20, an adhesive layer 15 for a metal plate 16 provided on the bottom surface of the film substrate 20, and the metal plate 16 stuck to the film substrate 20 with the adhesive layer 15 for a metal plate 16 interposed.

The adhesive layer 15 for a metal plate 16 is an adhesive layer for connecting the film substrate 20 and the metal plate 16. As the adhesive layer 15 for a metal plate 16, it is possible to use various types of adhesive material, such as an epoxy type, silicone type, polyimide type, polyester type, acrylic type, urethane type, phenol type, or a composite of these, etc. Insulation between the wiring layer 13 and the metal plate 16 is ensured by the film 11, so it is also possible to have a metal particle or ceramic filler for improving thermal conductivity contained in the adhesive layer 15 for a metal plate 16.

The metal plate 16 is a member for discharging heat generated from the light emitting elements 50 to the outside (heat dissipation plate). As the metal plate 16, it is possible to use an item with a highly heat conductive material such as an aluminum plate, a copper plate, or the like.

Light Emitting Device

The light emitting device 10 is provided with the metal-base substrate 30 described previously, which is provided with the film substrate 20, the adhesive layer 15 for a metal plate 16, and the metal plate 16.

The light emitting device 10 is provided with the metal-base substrate 30, and the light emitting elements 50 placed on the metal-base substrate 30.

The light emitting device 50 is placed on the metal-base substrate 30 by a p side electrode and an n side electrode of the light emitting element 50 being joined to the wiring layer 13 by joining members (bumps) 51.

As the joining member 51, it is possible to use a solder paste such as Sn—Ag—Cu or the like, for example.

The light emitting element 50 is specifically an LED chip, and depending on the application, an item of any wavelength can be selected. For example, as a blue (light of wavelength 430 nm to 490 nm) and green (light of wavelength 490 nm to 570 nm) light emitting element 50, it is possible to use a nitride-based semiconductor ($In_XAl_YGa_{1-X-Y}N$, 0≤X, 0≤Y, X+Y<1). Note that as the light emitting element 50, any item is acceptable provided it can be used for the light emitting device 10 of the present embodiment.

Operation of the Light Emitting Device

Next, describe the operation of the light emitting device will be described.

When the light emitting device 10 is driven, current is supplied via the wiring layer 13 from an external power supply to the light emitting elements 50, and light is emitted by the light emitting elements 50. For the light emitted by the light emitting elements 50, the light that advances upward is taken to outside above the light emitting device 10. Also, the light that advances downward or in a lateral direction, etc. is reflected by the film 11, the wiring layer 13, the protective layer 14, or the like, and is taken to outside the light emitting device 10.

Method for Manufacturing a Film Substrate, Method for Manufacturing a Metal-Base Substrate, and Method for Manufacturing a Light Emitting Device Next, an example of the manufacturing method for a film substrate, the manufacturing method for a metal-base substrate, and the manufacturing method for a light emitting device of the first embodiment is described while referring to FIG. 1A, FIG. 1B, FIG. 2, FIG. 3A to 3E, and FIG. 4A to 4C. The details of each member, which are the film substrate, the metal-base substrate, and the light emitting device, are as noted previously, so a description is omitted here.

Figure 2:
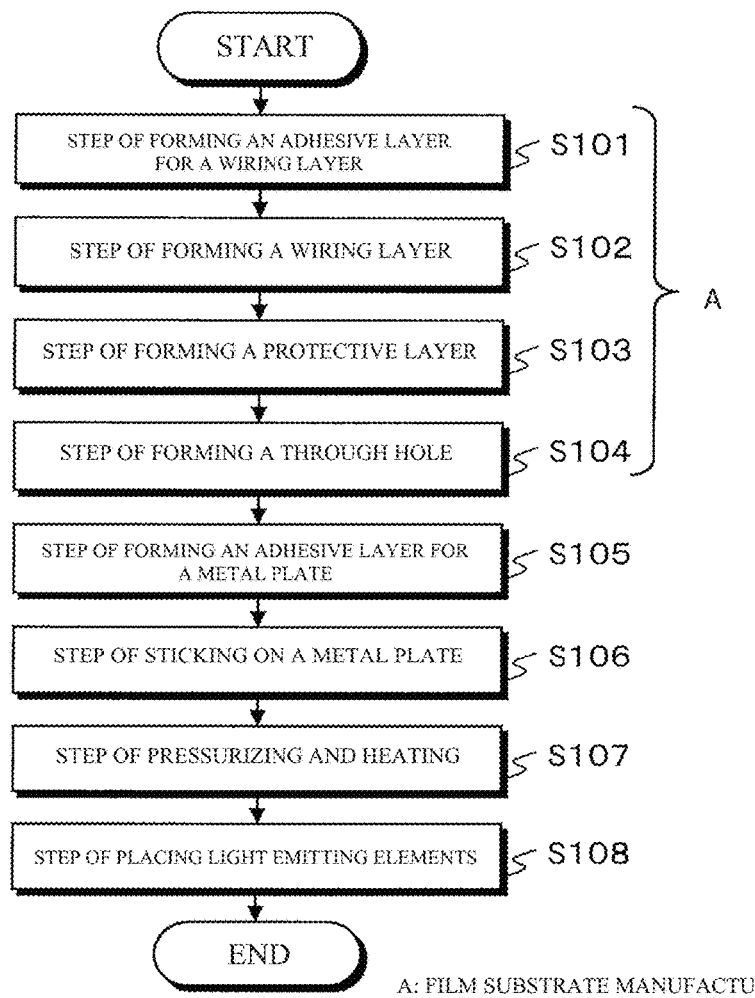
FIG. 2 is a flow chart showing the flow of the method for manufacturing a light emitting device of the first embodiment.
Figure 3A:
FIG. 3A is a cross section view schematically showing the formation step for an adhesive layer for a wiring layer in the method for manufacturing a light emitting device of the first embodiment, showing the state with the metal foil stuck on the adhesive layer for a wiring layer.
Figure 3B:
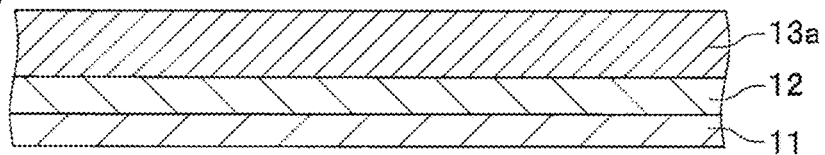
FIG. 3B is a cross section view schematically showing a wiring layer formation step in the method for manufacturing a light emitting device of the first embodiment, showing the state with a film stuck on the adhesive layer for a wiring layer.
Figure 3C:
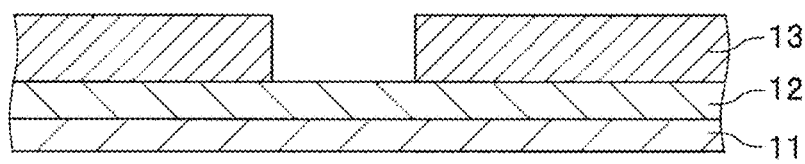
FIG. 3C is a cross section view schematically showing a wiring layer formation step in the method for manufacturing a light emitting device of the first embodiment, showing the state of a wiring layer with a portion of the metal foil removed.
Figure 3D:
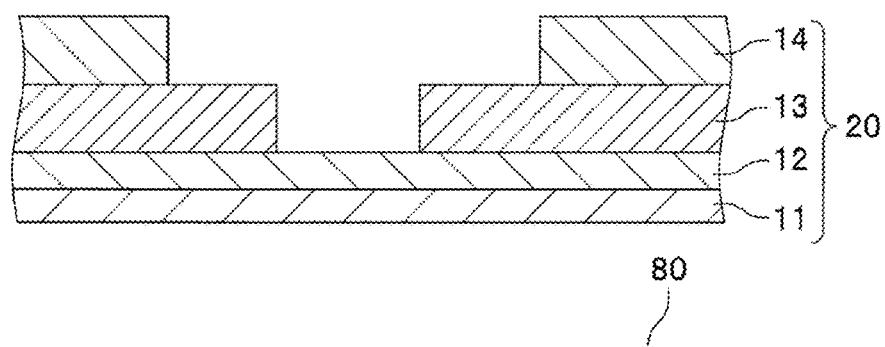
FIG. 3D is a cross section view schematically showing a protective layer formation step in the method for manufacturing a light emitting device of the first embodiment.
Figure 3E:
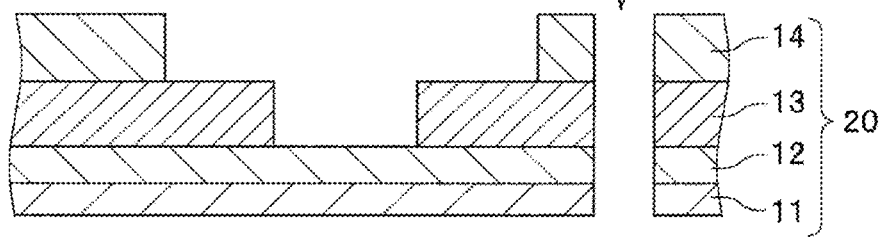
FIG. 3E is a cross section view schematically showing a through hole formation step in the method for manufacturing the light emitting device of the first embodiment.
Figure 4A:
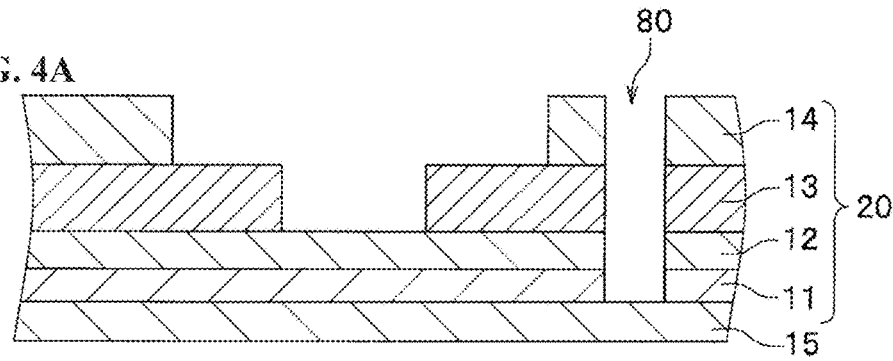
FIG. 4A is a cross section view schematically showing the formation step of an adhesive layer for a metal plate in the method for manufacturing the light emitting device of the first embodiment.
Figure 4B:
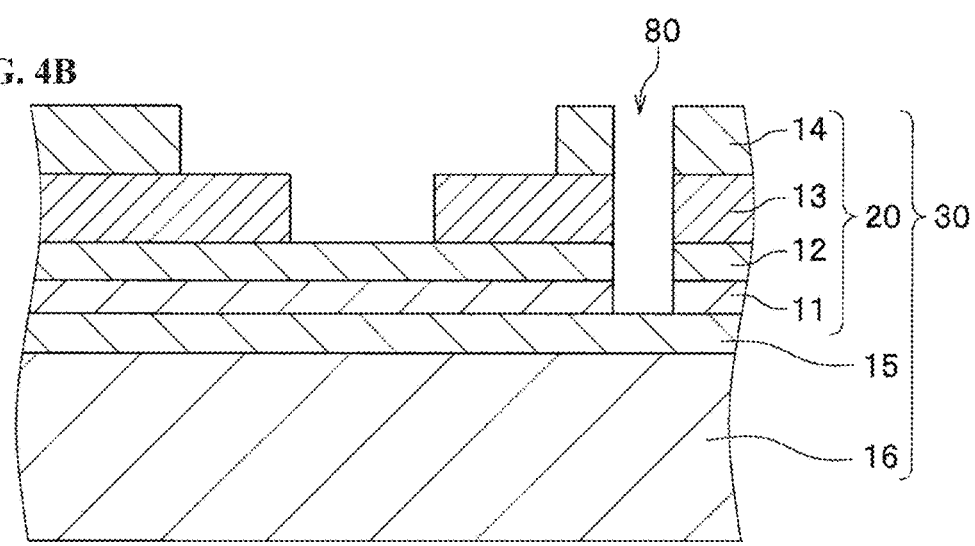
FIG. 4B is a cross section view schematically showing a metal plate sticking step in the method for manufacturing the light emitting device of the first embodiment.
Figure 4C:
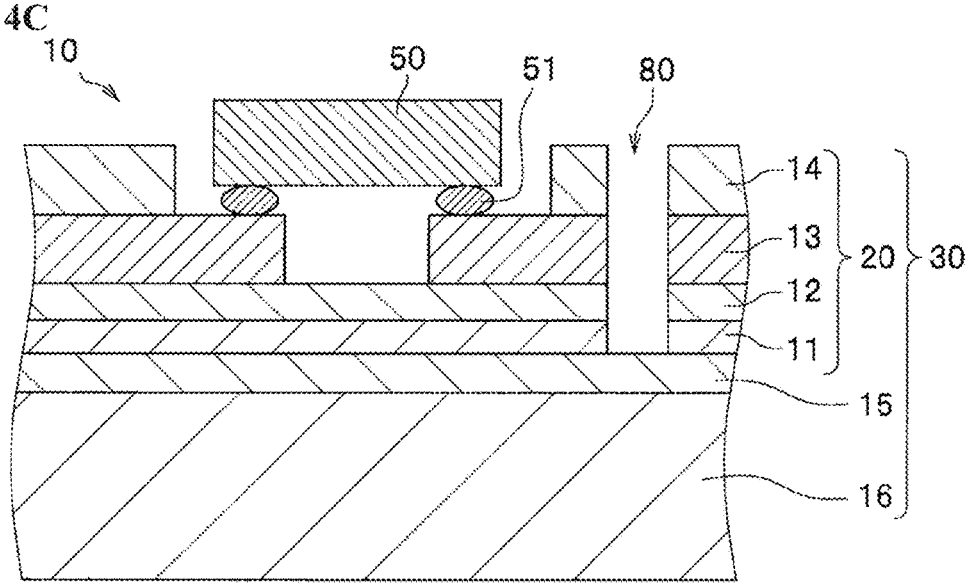
FIG. 4C is a cross section view schematically showing a light emitting element placement step in the method for manufacturing the light emitting device of the first embodiment.

FIG. 2 is a flow chart showing the flow of the method for manufacturing a light emitting device of the first embodiment. FIG. 3A is a cross section view schematically showing the formation step for an adhesive layer for a wiring layer in the method for manufacturing a light emitting device of the first embodiment, showing the state with the metal foil stuck on the adhesive layer for a wiring layer. FIG. 3B is a cross section view schematically showing a wiring layer formation step in the method for manufacturing a light emitting device of the first embodiment, showing the state with a film stuck on the adhesive layer for a wiring layer. FIG. 3C is a cross section view schematically showing a wiring layer formation step in the method for manufacturing a light emitting device of the first embodiment, showing the state of a wiring layer with a portion of the metal foil removed. FIG. 3D is a cross section view schematically showing a protective layer formation step in the method for manufacturing a light emitting device of the first embodiment. FIG. 3E is a cross section view schematically showing a through hole formation step in the method for manufacturing the light emitting device of the first embodiment. FIG. 4A is a cross section view schematically showing the formation step of an adhesive layer for a metal plate in the method for manufacturing the light emitting device of the first embodiment. FIG. 4B is a cross section view schematically showing a metal plate sticking step in the method for manufacturing the light emitting device of the first embodiment. FIG. 4C is a cross section view schematically showing a light emitting element placement step in the method for manufacturing the light emitting device of the first embodiment.

In the film substrate manufacturing step of the method for manufacturing a light emitting device, the film substrate of the embodiment is manufactured. Also, in the metal-base substrate manufacturing step of the method for manufacturing a light emitting device, the metal-base substrate of the embodiment is manufactured.

Method for Manufacturing a Film Substrate

The method for manufacturing a film substrate includes a formation step for an adhesive layer for a wiring layer S101, a wiring layer formation step S102, a protective layer formation step S103, and a through hole formation step S104, which are performed in that sequence. These steps constitute the film substrate manufacturing step.

Each step is described hereafter.

Adhesive Layer for a Wiring Layer Formation Step

The formation step for an adhesive layer for a wiring layer S101 is a step for forming the adhesive layer 12 for a wiring layer 13 on one surface of a metal foil 13a for forming the wiring layer 13.

Formation of the adhesive layer 12 for a wiring layer 13 on the metal foil 13a can be done using a method of coating an adhesive agent. For the adhesive agent coating method, a method can be selected that uses a dispenser, a printer, a coating machine, or the like to match the adhesive agent viscosity and coating thickness. After coating the adhesive agent, a semi-curing process such as heating, UV irradiation or the like can be added. In addition, instead of coating the adhesive agent, it is also possible to use an adhesive sheet.

Here, the adhesive layer 12 for a wiring layer 13 was provided on the metal foil 13a, but it is also possible to provide the adhesive layer 12 for a wiring layer 13 on one surface of the film 11.

Wiring Layer Formation Step

The wiring layer formation step S102 is a step for forming the wiring layer 13 on one surface of the film 11.

For formation of the wiring layer 13, first, the metal foil 13a is stuck to one surface of the film 11 with the adhesive layer 12 for a wiring layer 13 interposed. Specifically, the film 11 is stuck on the surface of the adhesive layer 12 for a wiring layer 13 on the side opposite to the side on which the metal foil 13a is provided. Next, for example, the wiring layer 13 is formed by the metal foil 13a of a prescribed thickness, which is formed on the film 11 with the adhesive layer 12 for a wiring layer 13 interposed, forming an electrical circuit pattern using photosensitive resist, and removing the unnecessary portion by etching.

As the method for forming the wiring layer 13, it is also possible to use a method that removes the unnecessary portion of the metal foil 13a using a laser. Also, in this example, the metal foil 13a was used, but it is also possible to use a method that forms the wiring layer 13 using printing of an electrically conductive paste instead of the metal foil 13a, or a method that forms the wiring layer 13 using a plating method. With any of the methods, formation of the wiring layer 13 is performed in a film state, so it is possible to use a roll-to-roll method with high production capacity per unit of time.

Protective Layer Formation Step

The protective layer formation step S103 is a step for forming the protective layer 14 at a prescribed position on the wiring layer 13.

Formation of the protective layer 14 can be performed using conventionally known methods. An example that can be listed is a method for forming the protective layer 14 by printing.

Through Hole Formation Step

The through hole formation step S104 is a step for forming the through hole 80, that pierces through the thickness direction of the film substrate 20, on the film substrate 20.

The through hole 80 can be formed using punching or a laser, for example.

When forming the through holes 80 using a laser, as the device for laser machining, the laser machining device noted in Japanese Laid-Open Patent Publication No. H10-323786, for example, can be listed as an example. Also, as a machining method for opening holes using a laser, the laser machining method noted in Japanese Laid-Open Patent Publication No. H6-142961, for example, can be listed as an example.

With the film substrate 20 used for the metal-base substrate 30, there are locations with and locations without the wiring layer 13 and the protective layer 14 on the film substrate 20, so a level difference is formed in the thickness direction. Because of that, when producing the metal-base substrate 30, when sticking together the film substrate 20 and the metal plate 16, bubbles are formed easily at the level difference location. Thus, due to these bubbles, the external appearance of the metal-base substrate 30 worsens, and there is the problem that the quality is lowered. Also, when bubbles are formed on a mounting part for components such as the light emitting elements or the like, this becomes an obstacle to mounting, and even in the periphery of the mounting part, there is a possibility of an adverse effect on electrical characteristics or heat dissipation characteristics. By forming the through holes 80 on the film substrate 20, the bubbles that formed between the film substrate 20 and the metal plate 16 when sticking the metal plate 16 to the film substrate 20 in the manufacturing of the metal-base substrate 30 can be more easily removed through the through holes 80.

Method for Manufacturing a Metal-Base Substrate

The method for manufacturing a metal-base substrate includes the film substrate manufacturing step, a formation step of an adhesive layer for a metal plate S105, a metal plate sticking step S106, and a pressurizing and heating step S107, which are performed in this sequence. These steps constitute the metal-base substrate manufacturing step.

Film Substrate Manufacturing Step

The film substrate manufacturing step is a step for manufacturing the film substrate 20 using the method for manufacturing a film substrate noted previously.

Adhesive Layer for a Metal Plate Formation Step

The formation step for an adhesive layer for a metal plate S105 is a step for forming the adhesive layer 15 for a metal plate 16 on the surface of the film substrate 20 on the side opposite to the surface on which the wiring layer 13 is provided. Specifically, with this step, the adhesive layer 15 for a metal plate 16 is formed on the other surface of the film 11.

For the formation of the adhesive layer 15 for a metal plate 16 to the other surface of the film 11, it is possible to use a method of coating an adhesive agent, for example. For the adhesive agent coating method, a method can be selected that uses a dispenser, a printer, a coating machine, or the like to match the adhesive agent viscosity and coating thickness. After coating the adhesive agent, a semi-curing process such as heating, UV irradiation or the like can be added. In addition, instead of coating the adhesive agent, it is also possible to use an adhesive sheet.

Here, the adhesive layer 15 for a metal plate 16 was provided on the film 11, but it is also possible to provide the adhesive layer 15 for a metal plate 16 on the metal plate 16.

Metal Plate Sticking Step

The metal plate sticking step S106 is a step for sticking the metal plate 16 on the surface of the film substrate 20 on the side opposite to the surface on which the wiring layer 13 is provided, with the adhesive layer 15 for a metal plate 16 interposed. Specifically, with this step, the metal plate 16 is stuck to the adhesive layer 15 for a metal plate 16 formed on the film substrate 20.

Pressurizing and Heating Step

The pressurizing and heating step S107 is a step for pressurizing and heating the substrate on which the metal plate 16 has been stuck.

As described previously, when sticking together the film substrate 20 and the metal plate 16, bubbles are formed easily between the film substrate 20 and the metal plate 16. To remove these bubbles, using a vacuum laminator device for vacuuming the atmosphere is effective, but when considering productivity, after sticking the metal plate 16 in an air environment, it is preferable to use a pressurized container such as an autoclave or the like to disperse the bubbles in a prescribed temperature and pressure environment. Therefore, the pressurizing and heating step is performed with the present embodiment.

The pressure during pressurizing is preferably 0.3 MPa or greater. Having the pressure be 0.3 MPa or greater makes removal of the bubbles easier. To further promote removal of the bubbles, it is more preferably 0.6 MPa, and even more preferably 0.8 MPa. On the other hand, even when set to 1.5 MPa or greater, the abovementioned effect becomes saturated, so it is preferably set to 1.5 MPa or less.

Also, the temperature when pressurizing is preferably 30° C. By having the temperature be 30° C. or greater, removal of the bubbles is easier. To further promote removal of the bubbles, it is more preferably 60° C. or greater, and even more preferably 90° C. or greater. On the other hand, even when set to 150° C. or greater, the abovementioned effect becomes saturated, so it is preferable set to 150° C. or less.

Also, as the holding time, from the perspective of improving the bubble removal effect, it is preferably 0.5 hours or longer, and from an economical perspective, it is preferably 3 hours or less.

Method for Manufacturing a Light Emitting Device

The method for manufacturing a light emitting device includes the metal-base substrate manufacturing step, and a light emitting element placement step S108, which are performed in that sequence.

Metal-Base Substrate Manufacturing Step

The metal-base substrate manufacturing step is a step for manufacturing the metal-base substrate using the method for manufacturing the metal-base substrate noted previously.

Light Emitting Element Placement Step

The light emitting element placement step S108 is a step for placing the light emitting elements 50 on the metal-base substrate 30.

Placement of the light emitting elements 50 is performed by joining the p side electrode and the n side electrode of the light emitting elements 50 respectively to the wiring layer 13 using joining members 51.

Second Embodiment

Film Substrate, Metal-Base Substrate, and Semiconductor Device

Next, the film substrate, the metal-base substrate, and the semiconductor device of a second embodiment are explained. The semiconductor device of the present embodiment is a semiconductor light emitting device (hereafter also called "light emitting device") that uses a semiconductor light emitting element (hereafter also called "light emitting element") as a semiconductor element.

Figure 5A:
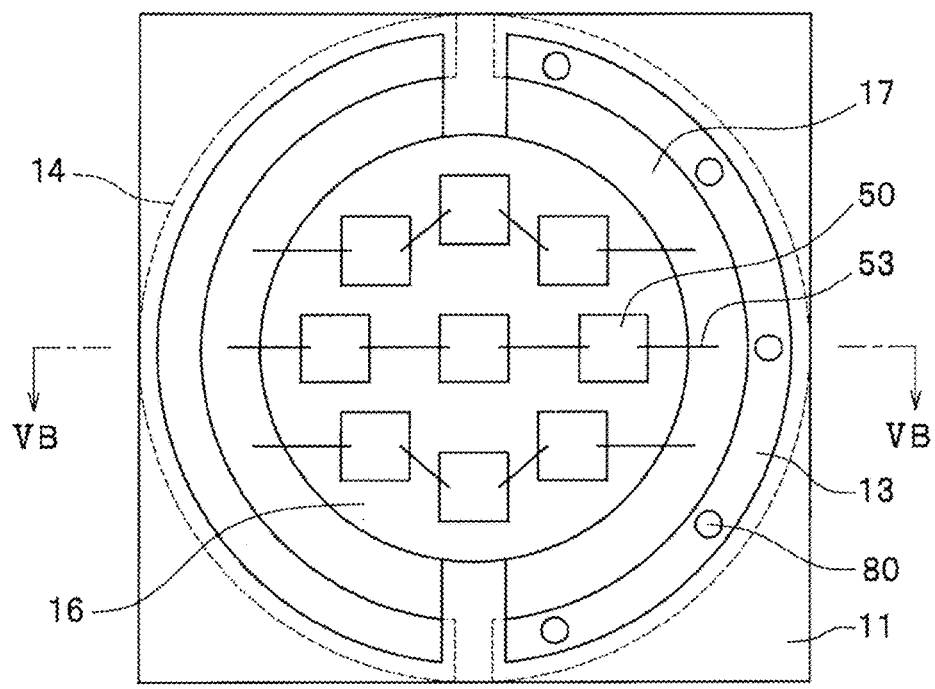
FIG. 5A is a plan view schematically showing the configuration of the light emitting device of a second embodiment.
Figure 5B:
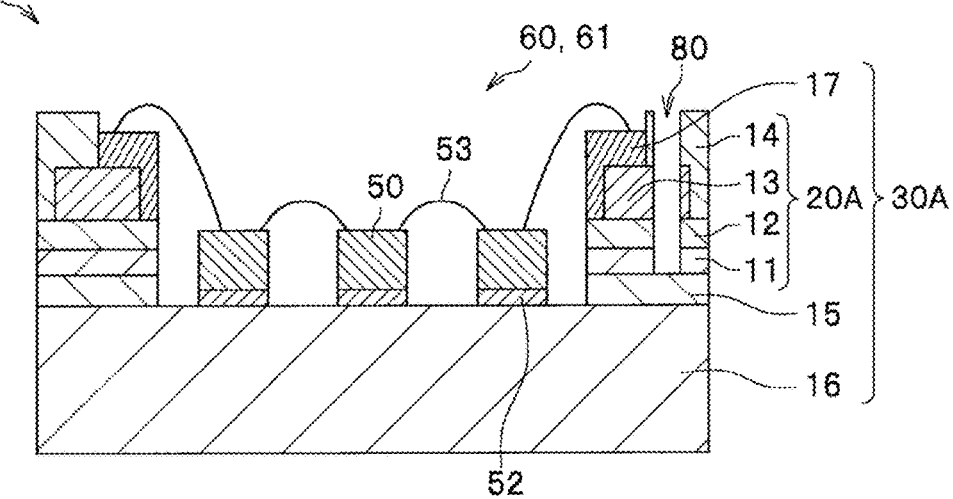
FIG. 5B is a cross section view schematically showing the configuration of the light emitting device of the second embodiment, showing the cross section of line VB-VB in FIG. 5A.

FIG. 5A is a plan view schematically showing the configuration of the light emitting device of a second embodiment. FIG. 5B is a cross section view schematically showing the configuration of the light emitting device of the second embodiment, showing the cross section of line VB-VB in FIG. 5A. In FIG. 5A, the protective layer 14 is shown only in the external form with a dotted line, illustrating a transparent state, and the adhesive layer 12 for a wiring layer 13 is not illustrated.

The film substrate, the metal-base substrate, and the semiconductor device of the second embodiment can be used for a high brightness illumination application called Chip on Board (COB).

The light emitting device 10A is provided with a metal-base substrate 30A provided with a film substrate 20A, the light emitting elements 50 placed on the metal-base substrate 30A, and wires 53 for connecting the light emitting elements 50 and the metal-base substrate 30A. First, after describing the film substrate 20A and the metal-base substrate 30A that constitute the light emitting device 10A, the light emitting device 10A will be described.

Here, the main parts that differ from the first embodiment are described.

Film Substrate

The film substrate 20A is provided with the film 11, the adhesive layer 12 for a wiring layer 13 provided on the film 11, the wiring layer 13 pattern-formed on the film 11 with the adhesive layer 12 for a wiring layer 13 interposed, and the protective layer 14 provided at a prescribed position on the wiring layer 13.

The film substrate 20A of the second embodiment has a hole 60 provided at the center part which is a prescribed area. Here, an item in a state with the hole 60 provided is used as the film substrate 20A.

The film substrate 20A of the second embodiment is the same as the film substrate 20 of the first embodiment other than the fact that the hole 60 is provided, and that the size of the wiring layer 13 is different. Note that the protective layer 14 is provided except for the sites at which the plating layer 17 is provided.

The diameter of the through hole 80 is the same as the first embodiment in terms of the lower limit, but for example when the size of the film 11 is vertically 100 mm×horizontally 100 mm, the upper limit is 5 μm or less.

Metal-Base Substrate

The metal-base substrate 30A is an item provided with the film substrate 20A described above, which is provided with the film 11, the adhesive layer 12 for a wiring layer 13, the wiring layer 13, and the protective layer 14.

The metal-base substrate 30A is provided with the film substrate 20A, the plating layer 17 provided at a prescribed position on the wiring layer 13 of the film substrate 20A, the adhesive layer 15 for a metal plate 16 provided on the bottom surface of the film 11, and the metal plate 16 stuck to the film substrate 20A with the adhesive layer 15 for a metal plate 16 interposed. To provide the plating layer 17 on the wiring layer 13, in a top view, it is preferable that the inside end part of the wiring layer 13 be provided further to the outside than the inside end part of the film 11. This is because even when the plating layer 17 is formed, it is thereby possible to provide the plating layer 17 without shrinking the surface area of the hole 60.

The film substrate 20A has the hole 60 provided at the center part which is a prescribed area. Also, in this example, the hole 60 is also provided at the center part which is a prescribed area for the adhesive layer 15 for a metal plate 16. These center parts are sites at which the mounting area of the light emitting elements 50 for the metal plate 16 is positioned, and are circular in a top view. Specifically, a circular shaped hole 60 in a top view is provided at the center part of the substrate comprising the film substrate 20A and the adhesive layer 15 for a metal plate 16.

The plating layer 17 is provided near the center of the film substrate 20A on the wiring layer 13. Also, the plating layer 17 and the protective layer 14 are provided in parallel on the same plane on the wiring layer 13. The thickness of the plating layer 17 can be 1 μm to 10 μm, for example. The plating layer 17 is provided not only on the top surface of the wiring layer 13, but also on the side surface. However, it is also possible to arrange the plating layer 17 only on the top surface of the wiring layer 13.

The metal-base substrate 30A has a recess 61 formed at a prescribed area by the substrate on which the hole 60 is provided, comprising the film substrate 20A and the adhesive layer 15 for a metal plate 16, and the metal plate 16 stuck to this substrate, with the hole 60 blocked by the metal plate 16. Also, the metal plate 16 is exposed at the bottom surface of the recess 61 by the hole 60 of the film substrate 20. This exposed recess 61 bottom surface becomes the mounting area for the light emitting elements 50. The adhesive layer 15 for a metal plate 16 and the metal plate 16 are the same as the adhesive layer 15 for a metal plate 16 and the metal plate 16 of the metal-base substrate 30 of the first embodiment.

Light Emitting Device

A light emitting device 10A is provided with the metal-base substrate 30A that is provided with the film substrate 20A, the plating layer 17, the adhesive layer 15 for a metal plate 16, and the metal plate 16 describe previously.

The light emitting device 10A is provided with the metal-base substrate 30A, the light emitting elements 50 placed on the metal-base substrate 30A, and the wires 53 for connecting the light emitting elements 50 and the metal-base substrate 30A. The light emitting elements 50 are joined to the mounting area of the light emitting elements 50 on the metal plate 16 by joining members 52.

The light emitting elements 50 are connected in series, with light emitting elements 50 adjacent in the horizontal direction to the mounting area electrically connected by the electrically conductive wires 53. Here, serially connected means a state in which the p side electrode and the n side electrode of adjacent light emitting elements 50 are electrically connected by the wires 53. Also, when FIG. 5A is seen in a top view, the light emitting elements 50 positioned at the left side end part of the mounting area and the plating layer 17 are electrically connected by the wires 53, and the light emitting elements 50 positioned at the right side end part of the mounting area and the plating layer 17 are electrically connected by the wires 53. However, the wire 53 connection method is not particularly limited, and parallel connection can also be used. Other points regarding the light emitting elements 50 are the same as for the light emitting elements 50 of the light emitting device 10 of the first embodiment.

As the joining member 52, it is possible to use a die bonding material such as silicone resin or the like, for example.

As the wire 53, it is possible to use a metal wire of gold, copper, silver, platinum, aluminum, or an alloy of these, for example.

Operation of the Light Emitting Device

Next, the operation of the light emitting device is explained.

When the light emitting device 10A is driven, current is supplied to the light emitting elements 50 from an external power supply via the wiring layer 13, and the light emitting elements 50 emit light. For the light emitted by the light emitting elements 50, the light that advances upward is taken to outside above the light emitting device 10A. Also, the light that advances downward or in a lateral direction, etc. is reflected by the film 11, the metal plate 16, the wiring layer 13, the protective layer 14, the plating layer 17 or the like, and is taken to outside the light emitting device 10A.

Method for Manufacturing a Film Substrate, Method for Manufacturing a Metal-Base Substrate, and Method for Manufacturing a Light Emitting Device Next, examples of the method for manufacturing the film substrate, the method for manufacturing the metal-base substrate, and the method for manufacturing the light emitting device of the second embodiment are described while referring to FIG. 5A, FIG. 5B, FIG. 6, FIG. 7A to 7E, FIG. 8A to 8C, and FIG. 9A to 9C. Details of each member, which are the film substrate, the metal-base substrate, and the light emitting device, are as noted previously, so a description is omitted here. Also, here, the main parts that differ from the first embodiment are described.

Figure 6:
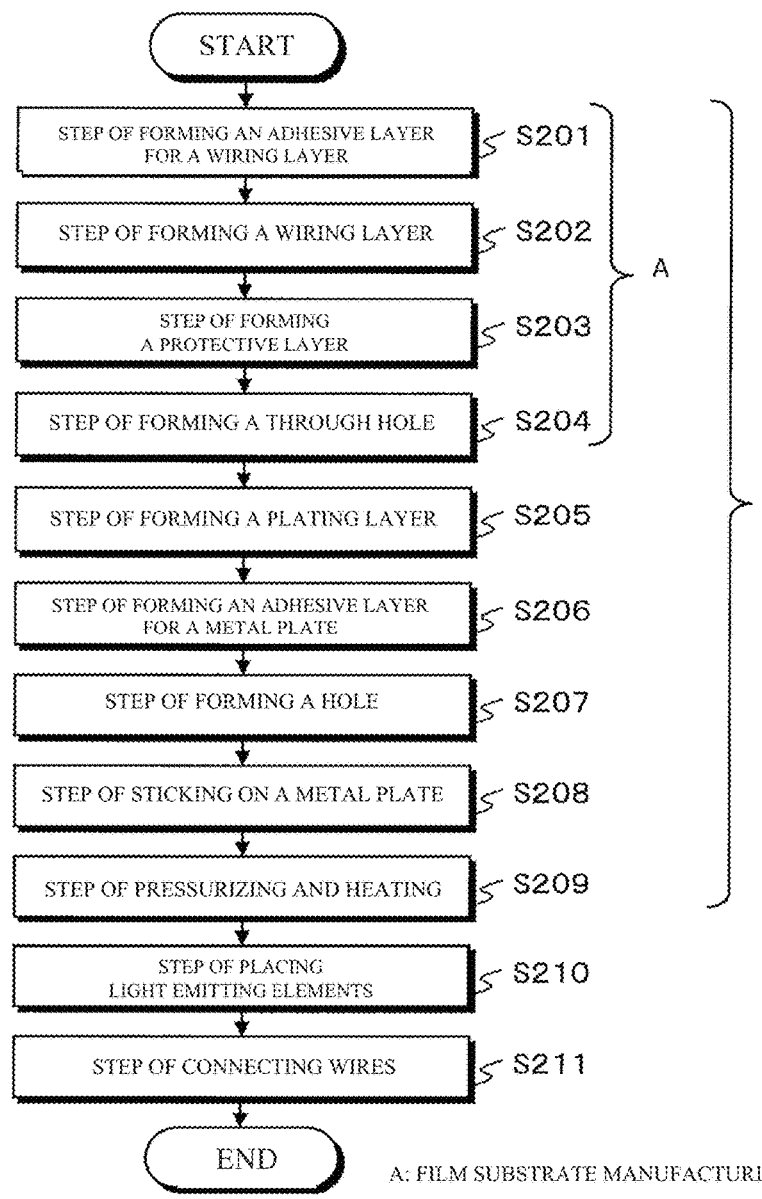
FIG. 6 is a flow chart showing the flow of the method for manufacturing a light emitting device of the second embodiment.
Figure 7A:
FIG. 7A is a cross section view schematically showing the formation step for an adhesive layer for a wiring layer in the method for manufacturing a light emitting device of the second embodiment, showing the state with the metal foil stuck on the adhesive layer for a wiring layer.
Figure 7B:
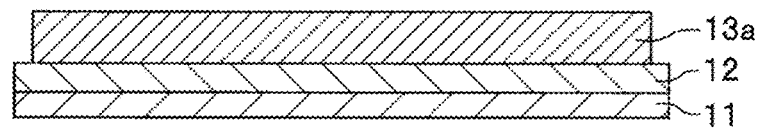
FIG. 7B is a cross section view schematically showing a wiring layer formation step in the method for manufacturing a light emitting device of the second embodiment, showing the state with a film stuck on the adhesive layer for a wiring layer.
Figure 7C:
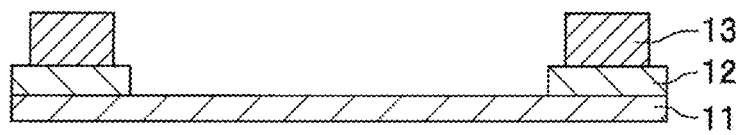
FIG. 7C is a cross section view schematically showing a wiring layer formation step in the method for manufacturing a light emitting device of the second embodiment, showing the state of a wiring layer with a portion of the metal foil and the adhesive layer for a wiring layer removed.
Figure 7D:
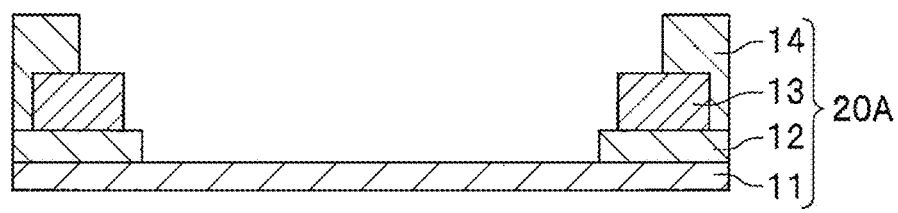
FIG. 7D is a cross section view schematically showing a protective layer formation step in the method for manufacturing a light emitting device of the second embodiment.
Figure 7E:
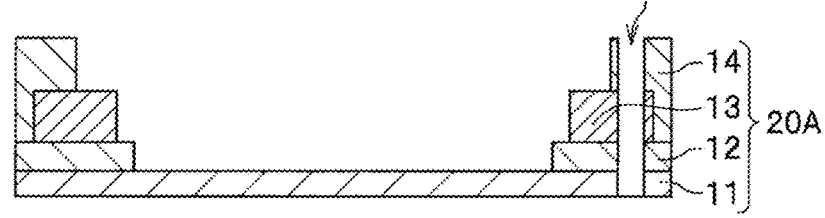
FIG. 7E is a cross section view schematically showing a through hole formation step in the method for manufacturing a light emitting device of the second embodiment.
Figure 8A:
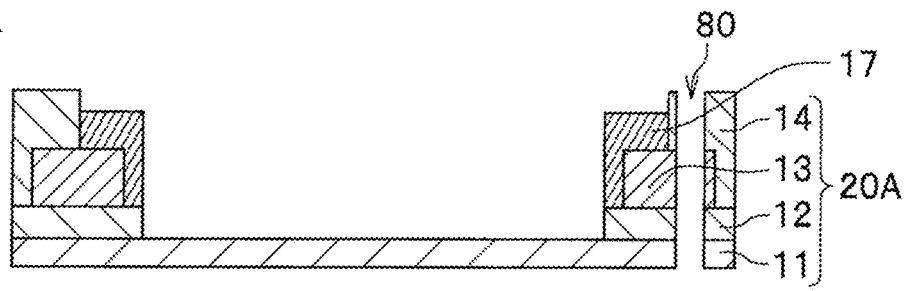
FIG. 8A is a cross section view schematically showing a plating layer formation step in the method for manufacturing a light emitting device of the second embodiment.
Figure 8B:
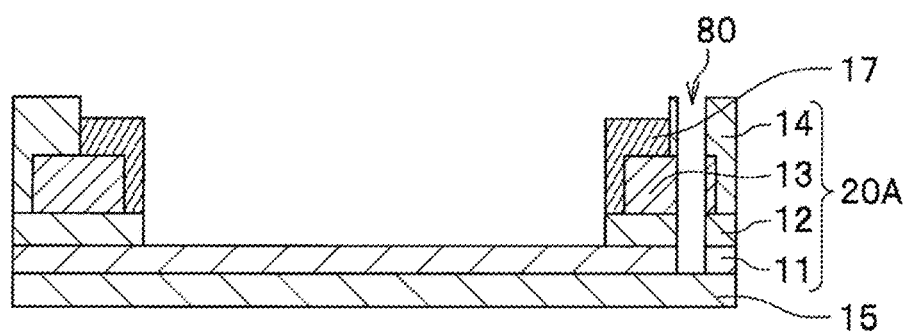
FIG. 8B is a cross section view schematically showing the formation step of an adhesive layer for a metal plate in the method for manufacturing a light emitting device of the second embodiment.
Figure 8C:
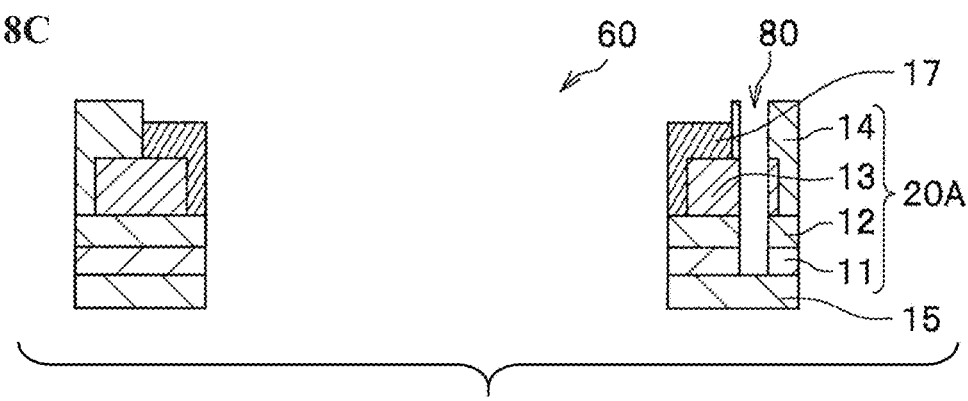
FIG. 8C is a cross section view schematically showing a hole formation step in the method for manufacturing a light emitting device of the second embodiment.
Figure 9A:
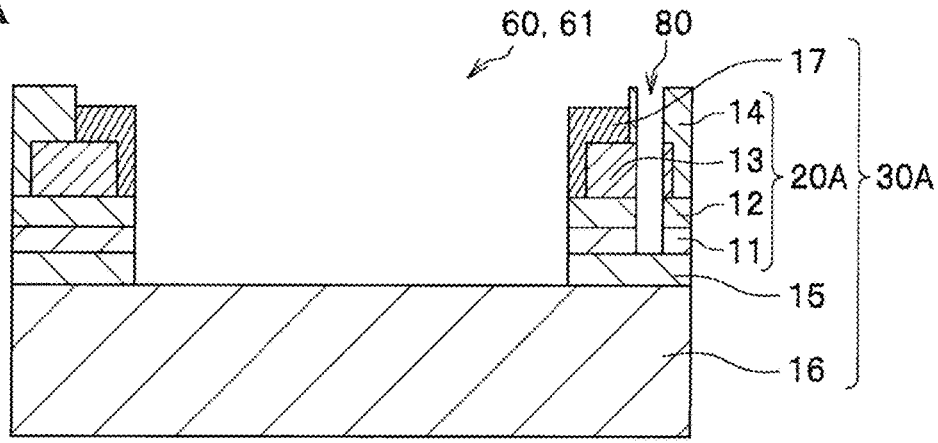
FIG. 9A is a cross section view schematically showing a metal plate sticking step in the method for manufacturing a light emitting device of the second embodiment.
Figure 9B:
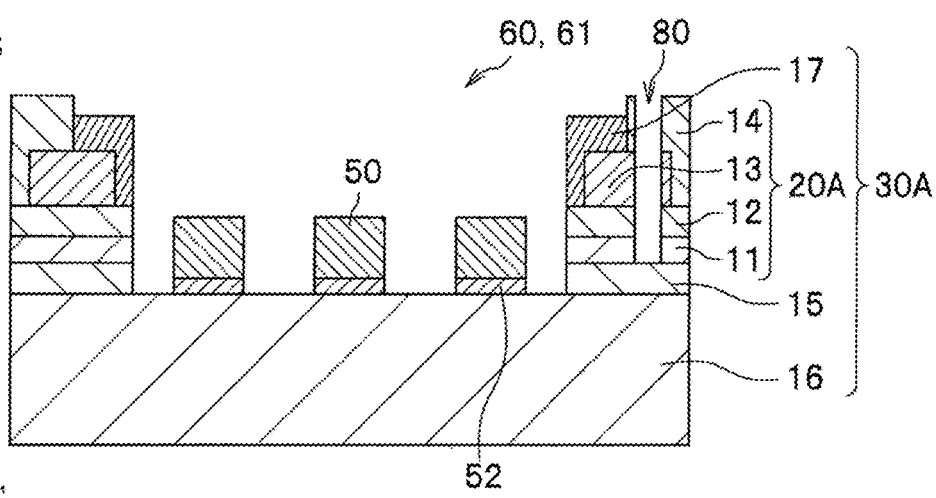
FIG. 9B is a cross section view schematically showing a light emitting element placement step in the method for manufacturing a light emitting device of the second embodiment.
Figure 9C:
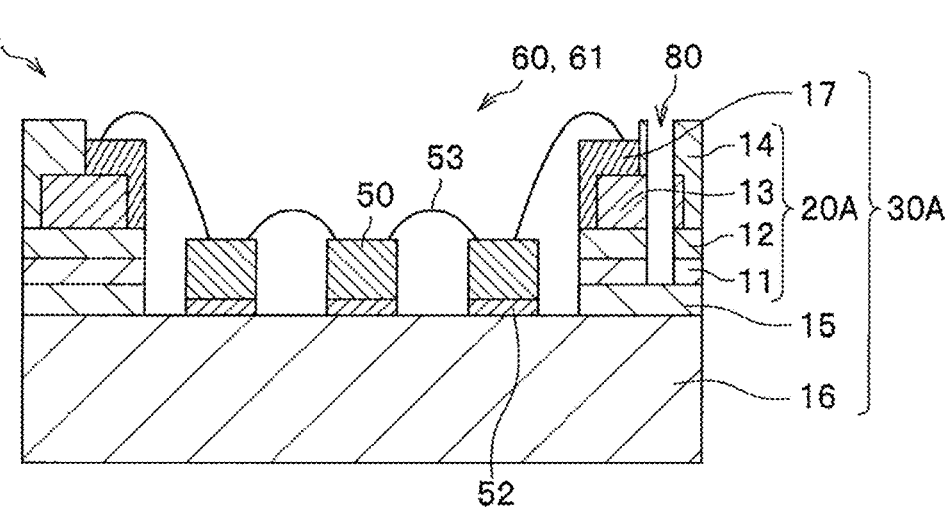
FIG. 9C is a cross section view schematically showing a wire connection step in the method for manufacturing a light emitting device of the second embodiment.

FIG. 6 is a flow chart showing the flow of the method for manufacturing a light emitting device of the second embodiment. FIG. 7A is a cross section view schematically showing the formation step for an adhesive layer for a wiring layer in the method for manufacturing a light emitting device of the second embodiment, showing the state with the metal foil stuck on the adhesive layer for a wiring layer. FIG. 7B is a cross section view schematically showing a wiring layer formation step in the method for manufacturing a light emitting device of the second embodiment, showing the state with a film stuck on the adhesive layer for a wiring layer. FIG. 7C is a cross section view schematically showing a wiring layer formation step in the method for manufacturing a light emitting device of the second embodiment, showing the state of a wiring layer with a portion of the metal foil and the adhesive layer for a wiring layer removed. FIG. 7D is a cross section view schematically showing a protective layer formation step in the method for manufacturing a light emitting device of the second embodiment. FIG. 7E is a cross section view schematically showing a through hole formation step in the method for manufacturing a light emitting device of the second embodiment. FIG. 8A is a cross section view schematically showing a plating layer formation step in the method for manufacturing a light emitting device of the second embodiment. FIG. 8B is a cross section view schematically showing the formation step of an adhesive layer for a metal plate in the method for manufacturing a light emitting device of the second embodiment. FIG. 8C is a cross section view schematically showing a hole formation step in the method for manufacturing a light emitting device of the second embodiment. FIG. 9A is a cross section view schematically showing a metal plate sticking step in the method for manufacturing a light emitting device of the second embodiment. FIG. 9B is a cross section view schematically showing a light emitting element placement step in the method for manufacturing a light emitting device of the second embodiment. FIG. 9C is a cross section view schematically showing a wire connection step in the method for manufacturing a light emitting device of the second embodiment.

In the film substrate manufacturing step for the method of manufacturing the light emitting device, the film substrate of the present embodiment is manufactured. Also, in the metal-base substrate manufacturing step in the method for manufacturing the light emitting device, the metal-base substrate of the present embodiment is manufactured.

Method for Manufacturing a Film Substrate

The method for manufacturing a film substrate includes a formation step of an adhesive layer for a wiring layer S201, a wiring layer formation step S202, a protective layer formation step S203, and a through hole formation step S204, and these are performed in that sequence. These steps constitute the film substrate manufacturing step.

The formation step of an adhesive layer for a wiring layer S201, the wiring layer formation step S202, the protective layer formation step S203, and the through hole formation step S204 are the same as in the method for manufacturing a film substrate of the first embodiment.

The protective layer 14 is provided on the wiring layer 13 except for the area on which the plating layer 17 is formed. Also, the site at which the hole 60 is formed has the metal foil 13a as well as the adhesive layer 12 for a wiring layer 13 removed (FIG. 7C).

Method for Manufacturing a Metal-Base Substrate

The method for manufacturing the metal-base substrate includes the film substrate manufacturing step, a plating layer formation step S205, a formation step of an adhesive layer for a metal plate S206, a hole formation step S207, a metal plate sticking step S208, and a pressurizing and heating step S209, and these are performed in that sequence. These steps constitute the metal-base substrate manufacturing step The film substrate manufacturing step, the formation step of an adhesive layer for a metal plate S206, and the pressurizing and heating step S209 are the same as in the method for manufacturing a film substrate of the first embodiment. Here, the film substrate manufacturing step is a step for manufacturing the film substrate 20A before formation of the hole 60.

Plating Layer Formation Step

The plating layer formation step S205 is a step for forming the plating layer 17 at the site on the wiring layer 13 at which the protective layer 14 is not formed. Formation of the plating layer 17 can be performed using a conventionally known electroplating method or electroless plating method. In addition to it being possible to provide the plating layer 17 only on the top surface of the wiring layer 13, it is also possible to provide the plating layer 17 on the top surface and the side surface of the wiring layer 13.

Hole Formation Step

The hole formation step S207 is a step for forming the hole 60 on a substrate comprising the film substrate 20A and the adhesive layer 15 for a metal plate 16. With this step, the film substrate 20A having the hole 60 is produced.

The hole 60 can be formed by cutting out the center part of the film substrate 20A to a prescribed size using a Thomson blade, for example. It is also possible to form the hole 60 using punching or a laser.

Here, the adhesive layer 15 for a metal plate 16 was provided on the film 11, but when providing the adhesive layer 15 for a metal plate 16 on the metal plate 16, the hole 60 should be formed on the center part of the adhesive layer for a metal plate 16 provided on the metal plate 16, and on the center part of the film substrate 20A.

Metal Plate Sticking Step

The metal plate sticking step S208 is a step for sticking the metal plate 16 on the surface of the film substrate 20A on the side opposite to the surface on which the wiring layer 13 is provided, with the adhesive layer 15 for a metal plate 16 interposed.

With this step, by sticking the metal plate 15 on the substrate on which the hole 60 is formed and blocking the hole 60, the recess 61 is formed on the substrate on which the metal plate 16 is stuck.

Method for Manufacturing a Light Emitting Device

The method for manufacturing a light emitting device includes the metal-base substrate manufacturing step, a light emitting element placement step S210, and a wire connection step S211, and these are performed in that sequence.

Metal-Base Substrate Manufacturing Step

The metal-base substrate manufacturing step is the method for manufacturing a metal-base substrate noted previously, and is a step for manufacturing the metal-base substrate 30A.

Light Emitting Element Placement Step

The light emitting element placement step S210 is a step for placing the light emitting elements 50 on the metal-base substrate 30A.

The placement of the light emitting elements 50 is performed by joining the light emitting elements 50 on the metal plate 16 exposed from the hole 60 using the joining members 52.

Wire Connection Step

The wire connection step S211 is a step for electrically connecting the light emitting elements 50 with each other, and the light emitting elements 50 with the plating layer 17, using the wires 53.

The method for connecting the wires 53 is not particularly limited, and can be performed using a normally used method.

Modification Examples

Next, modification examples will be described.

Figure 10A:
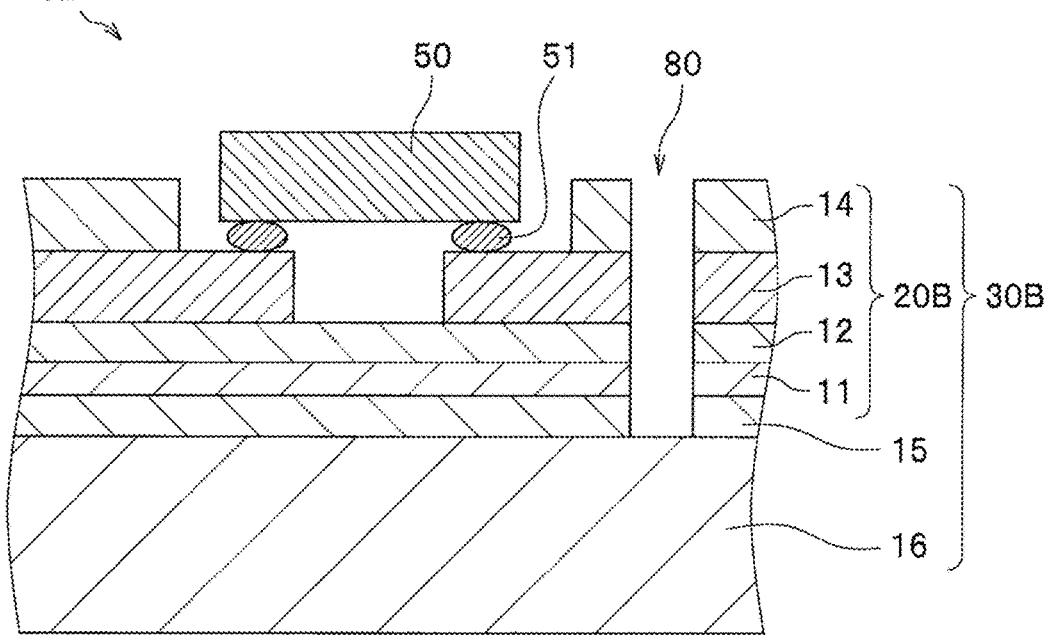
FIG. 10A is a cross section view schematically showing the configuration of the light emitting device of a modification example.
Figure 10B:
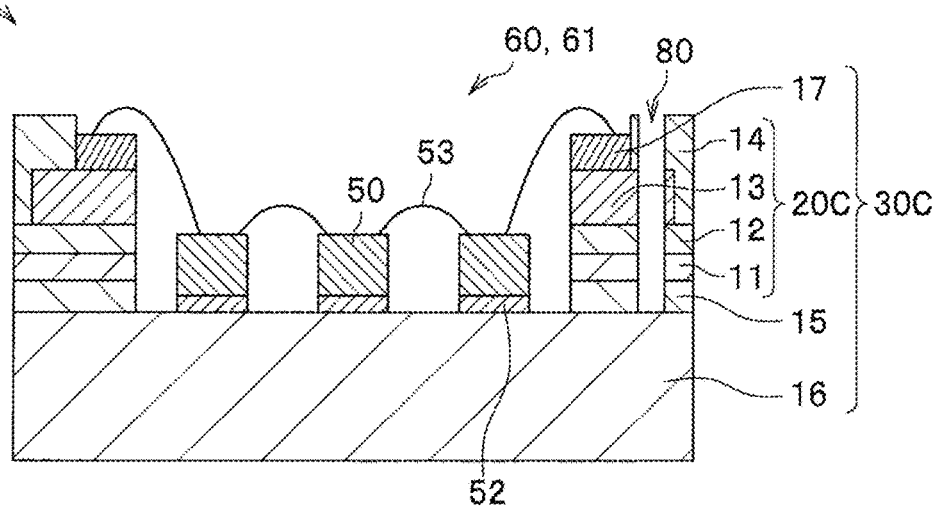
FIG. 10B is a cross section view schematically showing the configuration of the light emitting device of a modification example.
Figure 11A:
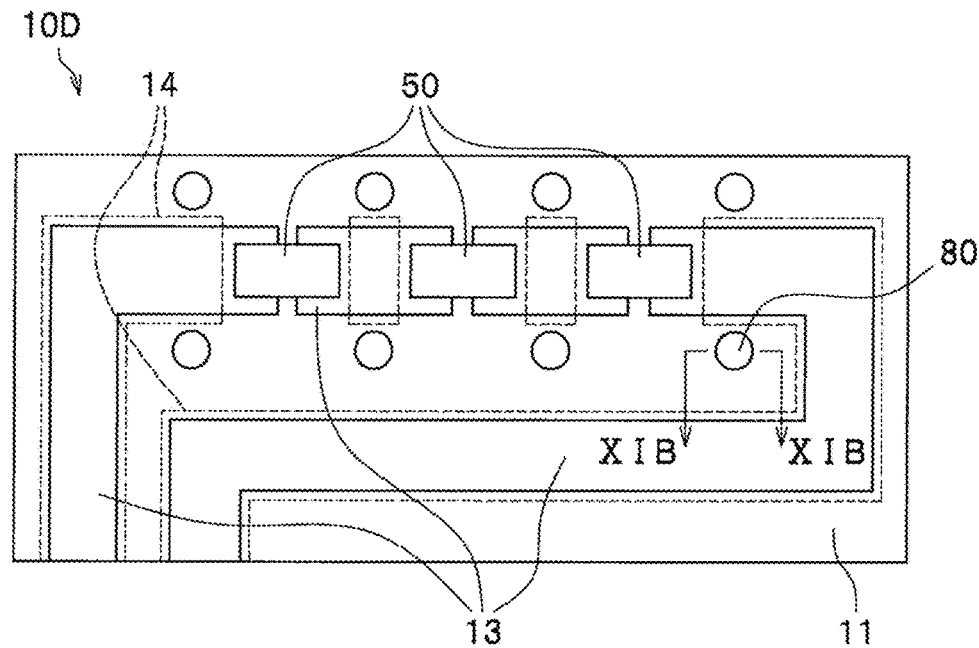
FIG. 11A is a plan view schematically showing the configuration of the light emitting device of a modification example.
Figure 11B:
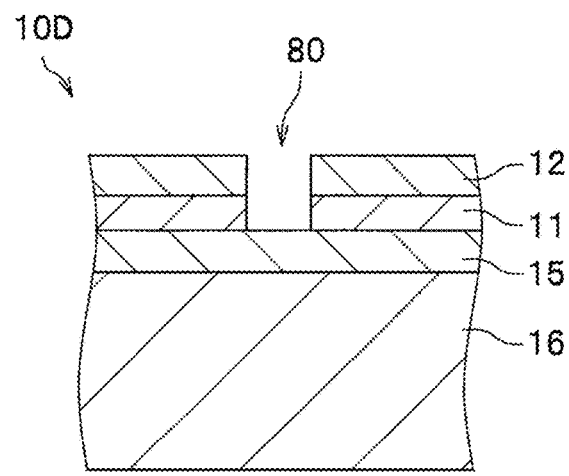
FIG. 11B is a cross section view schematically showing the configuration of the light emitting device of a modification example, showing the cross section of line XIB-XIB of FIG. 11A.
Figure 12A:
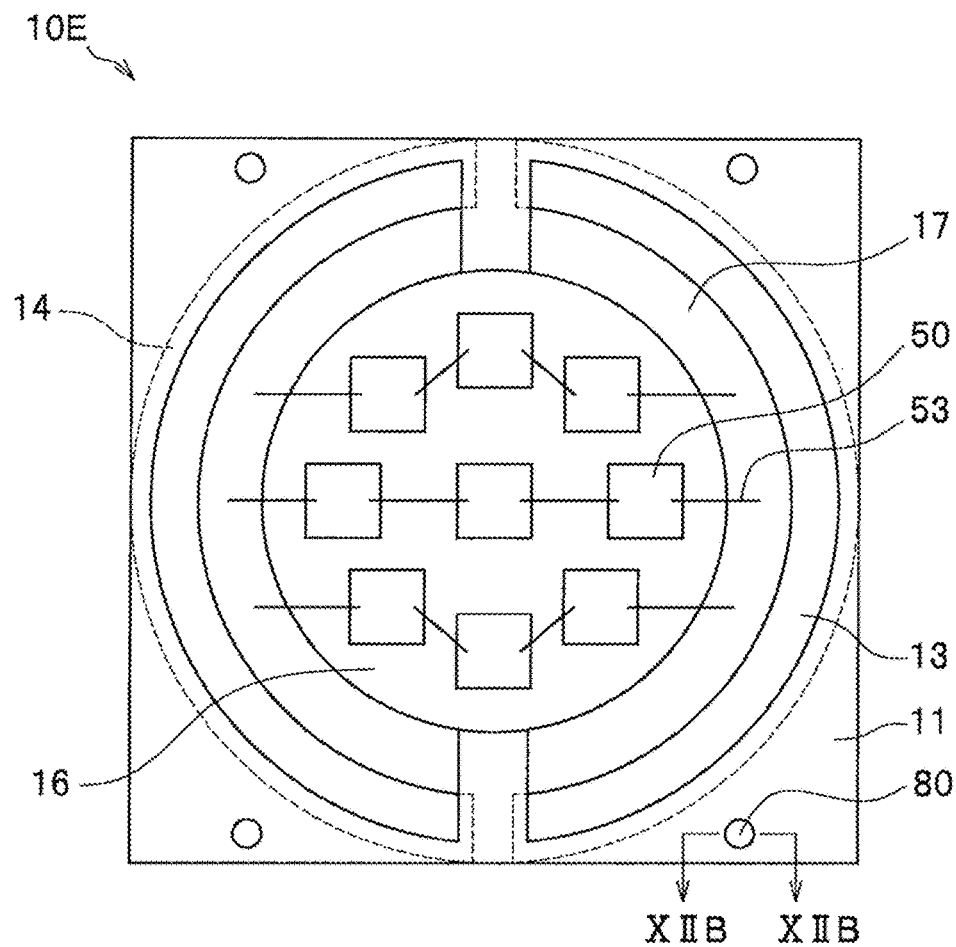
FIG. 12A is a plan view schematically showing the configuration of the light emitting device of a modification example.
Figure 12B:
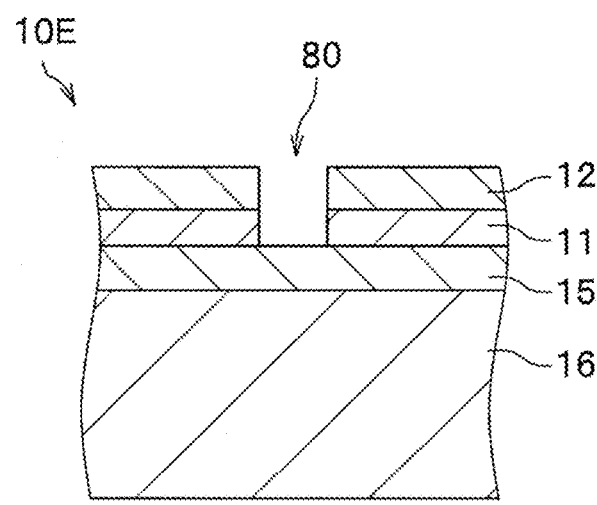
FIG. 12B is a cross section view schematically showing the configuration of the light emitting device of a modification example, showing the cross section of line XIIB-XIIB of FIG. 12A.
Figure 13:
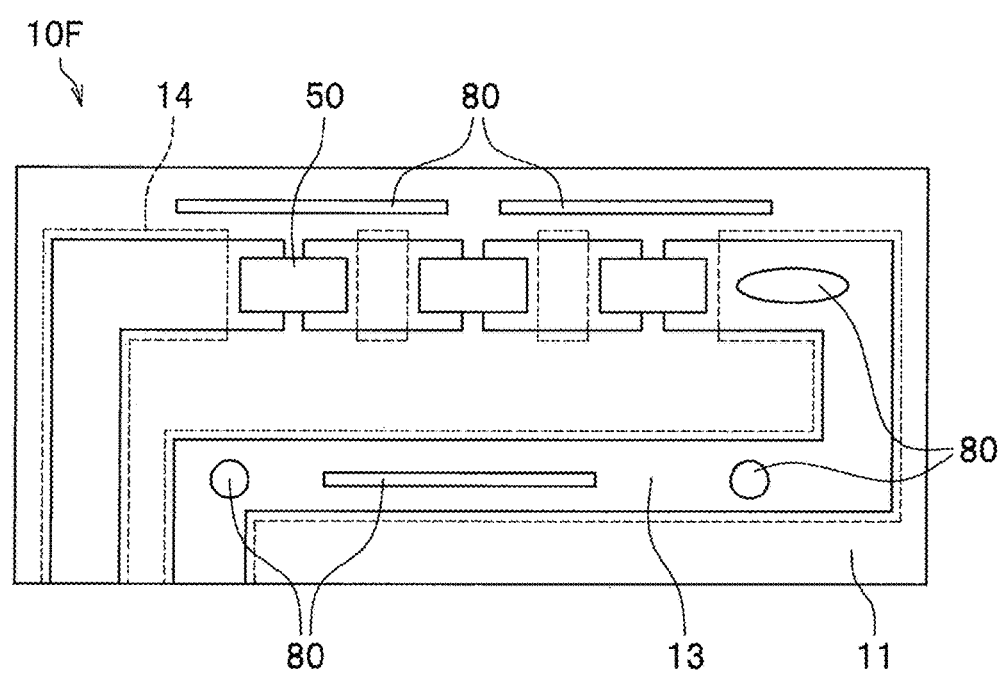
FIG. 13 is a plan view schematically showing the configuration of the light emitting device of a modification example.

FIG. 10A and FIG. 10B are cross section views schematically showing the configuration of the light emitting device of modification examples. FIG. 11A is a plan view schematically showing the configuration of the light emitting device of a modification example. FIG. 11B is a cross section view schematically showing the configuration of the light emitting device of a modification example, showing the cross section of line XIB-XIB of FIG. 11A. FIG. 12A is a plan view schematically showing the configuration of the light emitting device of a modification example. FIG. 12B is a cross section view schematically showing the configuration of the light emitting device of a modification example, showing the cross section of line XIIB-XIIB of FIG. 12A. FIG. 13 is a plan view schematically showing the configuration of the light emitting device of a modification example. Note that in FIG. 11A, FIG. 12A, and FIG. 13, the protective layer 14 is shown only in the external form with a dotted line, illustrating a transparent state, and the adhesive layer 12 for a wiring layer 13 is not illustrated.

With the first embodiment and the second embodiment noted above, the through hole 80 was formed on the film substrates 20, 20A, but it is also possible to form the through hole 80 on the adhesive layer 15 for a metal plate 16. With the light emitting devices 10B, 10C shown in FIG. 10B, the metal-base substrates 30B, 30C are in communication with the film substrates 20B, 20C and the adhesive layer 15 for a metal plate 16, and there is a through hole 80 in the thickness direction of the film substrates 20B, 20C and the adhesive layer 15 for a metal plate 16.

Specifically, the metal-base substrates 30B, 30C have the through hole 80 formed on the film substrates 20B, 20C, this through hole 80 reaches to the bottom surface of the adhesive layer 15 for a metal plate 16, and the through hole 80 is also formed on the adhesive layer 15 for a metal plate 16. In this way, for the through hole 80, the through hole 80 of the film substrates 20B, 20C is formed integrally with the through hole 80 of the adhesive layer 15 for a metal plate 16.

The through hole 80 in communication with the film substrates 20B, 20C and the adhesive layer 15 for a metal plate 16 can be provided integrally with the film substrate 20B, 20C and the adhesive layer 15 for a metal plate 16 after sticking the adhesive layer 15 for a metal plate 16 on the film substrates 20B, 20C before providing the through hole 80. However, it is also possible to do sticking after forming the through hole 80 in advance at a desired position on the film substrates 20B, 20C and a desired position on the adhesive layer 15 for a metal plate 16.

With the first embodiment and the second embodiment noted above, the through hole 80 was formed on the part of the film substrates 20, 20A with the wiring layer 13, but as shown with the light emitting devices 10D, 10E shown in FIG. 11A, FIG. 11B, FIG. 12A, and FIG. 12B, it can also be formed on a part without the wiring layer 13.

Also, the through hole 80 is not limited to being circular in a top view, and for example, as with the light emitting device 10F shown in FIG. 13, can also be a square shape or an oval shape. When the through hole 80 is a shape other than a circle, in a top view, for example in the case of an oval shape, the minor axis, and in the case of a square shape, the short side, is preferably 30 μm or greater.

With the modes of light emitting devices 10D, 10E, shown are items for which the through hole 80 is formed on the film substrate, but it is also possible to form the through hole 80 on the adhesive layer 15 for a metal plate 16.

With the first embodiment and the second embodiment noted above, the mode was such that the adhesive layer 12 for a wiring layer 13 was used to provide the metal foil 13a, but it is also possible to stick the film 11 having an adhesive property on the metal foil 13a without providing the adhesive layer 12 for a wiring layer 13.

With the method for manufacturing the metal-base substrate of the first embodiment and the second embodiment noted above, a pressurizing and heating step was performed, but it is also possible to not perform the pressurizing and heating step. Instead of the pressurizing and heating step, it is also possible to place the substrate on which the metal plate 16 is stuck into a vacuum laminating device, and perform a step of exposing in a vacuum atmosphere.

With the method for manufacturing the metal-base substrate of the first embodiment and the second embodiment noted above, the through hole 80 was provided. However, as the method for manufacturing a metal-base substrate, it is also possible to use a manufacturing method for which the through hole 80 is not provided. With this kind of manufacturing method as well, because it is possible to manufacture the film substrate using the roll-to-roll method, it is possible to reduce manufacturing costs.

With the second embodiment noted above, an item in a state without the plating layer 17 provided was used as the film substrate 20A. However, it is also possible to use an item in a state with the plating layer 17 provided as the film substrate. Also, with the method for manufacturing the metal-base substrate of the second embodiment, an item was used with the plating layer 17 formed on the film substrate 20A on which the through hole 80 was formed, but it is also possible to form the through hole 80 on the film substrate on which the plating layer 17 is formed.

Also, with the method for manufacturing the metal-base substrate of the first embodiment and the second embodiment noted above, it is also possible to form the through hole 80 after sticking on the metal plate 16, or after forming the hole 60.

With the light emitting device 10A of the second embodiment noted above, it is also possible to provide a translucent sealing member on the recess 61. As the sealing member, examples that can be listed include polycarbonate resin, epoxy resin, phenol resin, silicone resin, acrylic resin, TPX resin, polynorbornene resin, modified resins of these, or hybrid resins of one or more types of these resins. It is also possible to have the sealing member contain a diffusing agent, a fluorescent material or the like.

As described above, the method for manufacturing a film substrate, the method for manufacturing a metal-base substrate, and the method for manufacturing a light emitting device of the present embodiments have the wiring layer formed in a film state, so processing using the roll-to-roll method is possible. The roll-to-roll method has dramatically higher processing capacity per unit of time compared with the sheet feed method, so it is possible to reduce the process costs. Also, it is possible to reduce the materials cost by using an inexpensive film instead of an expensive insulating resin. These also make it possible to reduce the manufacturing cost.

The film substrate, the metal-base substrate, and the light emitting device of the present embodiments have reduced manufacturing costs. Also, the metal-base substrate and the light emitting device of the present embodiments have the through hole, and thus bubbles that form inside the metal-base substrate are reduced, resulting in excellent quality, without having an adverse effect on the electrical characteristics and heat dissipation characteristics.

Working Example

Following, a detailed description is given of a working example of the present invention. It goes without saying that the present invention is not limited to only the working example shown hereafter.

Figure 14A:
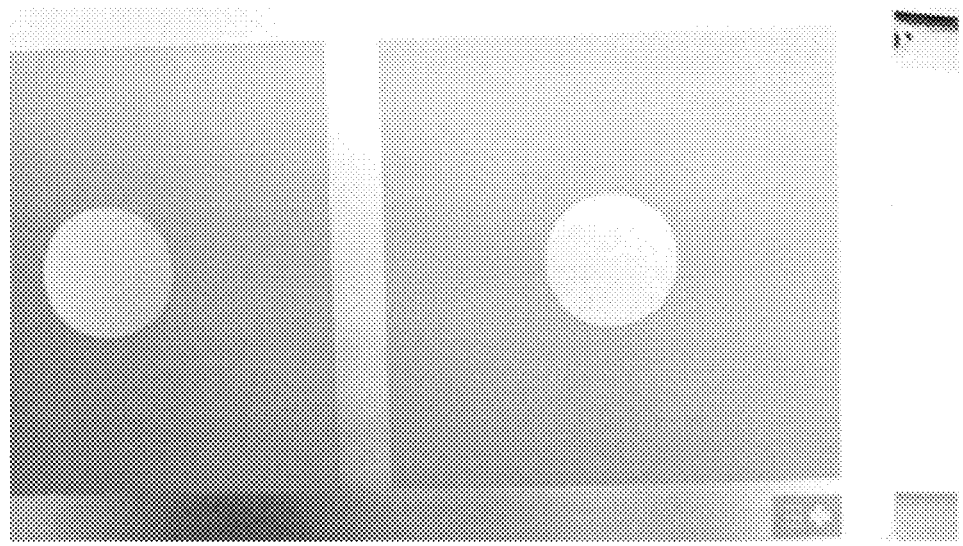
FIG. 14A is an image of a metal-base substrate of a working example.
Figure 14B:
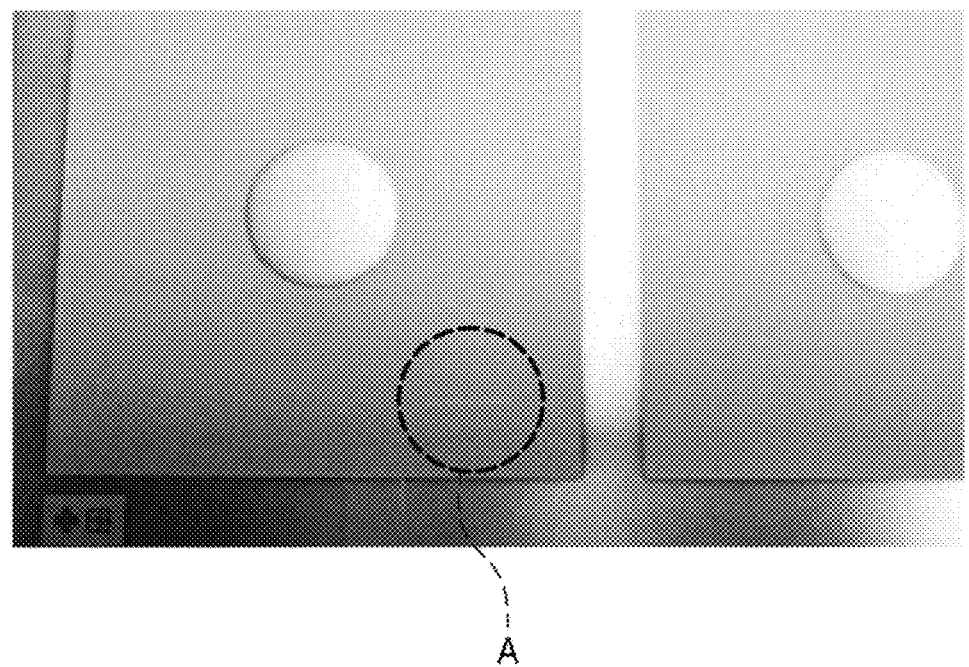
FIG. 14B is an image of a metal-base substrate of a reference example.

FIG. 14A is an image of a metal-base substrate of a modification example. FIG. 14B is an image of a metal-base substrate of a reference example.

Working Example

Production of the Film Substrate

Using the procedure noted below, the film substrate for a metal-base and the film substrate for a COB were produced.

First, on the entire surface of one surface of an electrolytic copper foil (52 μm thick) made by Circuit Foil Luxembourg Co., Ltd., an epoxy-based adhesive agent was coated using the roll-to-roll method so as to have a thickness of 10 μm after drying. Next, using the roll-to-roll method, a polyimide film made by Ube Industries, Ltd. (Upilex-S (registered trademark) (25 μm thick)) is stuck on with an adhesive layer interposed, and this was cured in an oven. Next, a series of steps including dry film sticking, exposure, development, and etching was performed on the copper foil using the roll-to-roll method, forming a prescribed circuit pattern of the film substrate for a metal-base and the film substrate for COB. Next, at a site excluding the light emitting element mounting area on the copper foil, or on a site excluding the site at which the plate layer is provided on the copper foil, a white resist (S-500WF01) made by Taiyo Ink Manufacturing Co., Ltd. was printed using the toll-to-roll method so as to cover the copper foil at a thickness of 20 μm after drying, and this was cured in an oven. Thus, the roll form film substrate for a metal-base and film substrate for COB were produced.

Production of Metal-Base Substrate and Light Emitting Device

First, an adhesive sheet (SAFQ (25 μm thick)) made by Nikkan Industries Co., Ltd. was stuck on the polyimide surface of the film substrate for a metal-base using the roll-to-roll method. Next, using the roll-to-sheet method, an aluminum plate (A5052 alloy (1 mm thick)) made by UACJ Co., Ltd. was stuck to the adhesive sheet. Next, the substrate on which the aluminum plate was stuck was placed in an autoclave, and the metal-base substrate was produced by holding for one hour at 90° C. at 0.8 MPa. Then, the light emitting element was mounted at a prescribed position on the metal-base substrate to produce the light emitting device.

Production of the Substrate for COB and the Light Emitting Device

First, an Ni—Pd—Au layer was formed on the film substrate for COB using the electroless plating method. Next, an adhesive sheet (SAFQ (25 μm thick)) made by Nikkan Industries Co., Ltd. was stuck to the polyimide surface of the film substrate using the roll-to-roll method. Next, a hole was provided at a prescribed location using a Thomson blade, after which the film substrate was cut to a prescribed size. Next, a highly reflective aluminum plate (Micro-Silver (0.7 mm thick)) made by Alanod Co., Ltd. was stuck to the adhesive sheet. Next, the substrate on which the aluminum plate was stuck was put into an autoclave, and the substrate for COB was produced by holding for one hour at 90° C. at 0.8 MPa. Also, the light emitting elements were mounted at prescribed positions of the substrate for COB, and after connecting the wires, a protective layer was provided on the top surface of the light emitting element by filling a sealing member in the recess of the substrate for COB, producing the light emitting device.

Reference Example

Production of the Metal-Base Substrate

Using the roll-to-roll method, an adhesive sheet (SAFQ (25 μm thick)) made by Nikkan Industries Co., Ltd. was stuck to the polyimide surface of the film substrate for the metal-base, which is the same as that of the working example. Next, an aluminum plate (A5052 alloy (1 mm thick)) made by UACJ Co., Ltd. was stuck to the adhesive sheet using the roll-to-sheet method. Next, the substrate on which the aluminum plate was stuck was placed in an oven, and the metal-base substrate was produced by holding this for one hour at 90° C.

Observation of the External Appearance of the Working Example and the Reference Example FIGS. 14A and 14B show photographs of the external appearance of a portion of the metal-base substrate of the working example and the metal-base substrate of the reference example. Code A indicates the site at which bubbles formed. With the metal-base substrate of the reference example, bubbles can be confirmed near the level difference part due to copper foil, but with the metal-base substrate of the working example, no bubbles are seen. Specifically, it was found that bubble dispersion using an autoclave was effective.

The metal-base substrate of the present invention is effective technology for circuit boards requiring high heat dissipation characteristics such as for liquid crystal televisions, lighting, etc., and for light emitting devices using those.

The light emitting device of the present invention is effective technology for light emitting devices using circuit boards requiring high heat dissipation characteristics such as for liquid crystal televisions, lighting, etc.

Although the present disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A method for manufacturing a metal-base substrate comprising:
   preparing a film substrate by forming a wiring layer on a first surface of the film substrate;
   forming a through hole on a ground part of the wiring layer, with the through hole piercing through the film substrate in a thickness direction of the film substrate; and
   after the forming of the through hole, sticking a metal plate on a second surface of the film substrate opposite from the first surface, with an adhesive layer being interposed between the metal plate and the film substrate.

2. The method for manufacturing a metal-base substrate according to claim 1, further comprising
   pressurizing and heating the film substrate after the sticking of the metal plate on the film substrate.

3. The method for manufacturing a metal-base substrate according to claim 2, wherein the pressurizing of the film substrate includes pressurizing the film substrate with a pressure of 0.3 MPa or greater.

4. The method for manufacturing a metal-base substrate according to claim 1, further comprising
   before the sticking of the metal plate on the film substrate, providing the adhesive layer on the second surface of the film substrate, and forming a hole in the film substrate on which the adhesive layer is provided, wherein
   the sticking of the metal plate on the film substrate includes blocking the hole by the metal plate to define a recess in the metal-base substrate.

5. The method for manufacturing a metal-base substrate according to claim 1, further comprising
   before the sticking of the metal plate on the film substrate, providing the adhesive layer on the second surface of the film substrate, wherein
   the forming of the through hole includes forming the through hole piercing through the film substrate and the adhesive layer.

6. The method for manufacturing a metal-base substrate according to claim 1, wherein a diameter of the through hole is 30 µm or greater.

7. The method for manufacturing a metal-base substrate according to claim 1, wherein the forming of the through hole includes forming a plurality of through holes.

8. The method for manufacturing a metal-base substrate according to claim 1, wherein the forming of the wiring layer includes forming the wiring layer using a roll-to-roll method.

9. A method for manufacturing a semiconductor device comprising:
   placing semiconductor elements on the metal-base substrate manufactured with the method for manufacturing a metal-base substrate according to claim 1.

10. A method for manufacturing a metal-base substrate comprising:
    preparing a film substrate by forming a wiring layer on a first surface of the film substrate;
    providing an adhesive layer on a second surface of the film substrate opposite from the first surface and forming a through hole on a ground part of the wiring layer, with the through hole piercing through the film substrate and the adhesive layer; and
    sticking a metal plate on the second surface of the film substrate, with the adhesive layer being interposed between the metal plate and the film substrate.

11. The method for manufacturing a metal-base substrate according to claim 10, further comprising
    pressurizing and heating the film substrate after the sticking of the metal plate on the film substrate.

12. The method for manufacturing a metal-base substrate according to claim 11, wherein the pressurizing of the film substrate includes pressurizing the film substrate with a pressure of 0.3 MPa or greater.

13. The method for manufacturing a metal-base substrate according to claim 10, further comprising
    before the sticking of the metal plate on the film substrate, forming a hole in the film substrate on which the adhesive layer is provided, wherein
    the sticking of the metal plate on the film substrate includes blocking the hole by the metal plate to define a recess in the metal-base substrate.

14. The method for manufacturing a metal-base substrate according to claim 10, wherein a diameter of the through hole is 30 µm or greater.

15. The method for manufacturing a metal-base substrate according to claim 10, wherein the forming of the through hole includes forming a plurality of through holes.

16. The method for manufacturing a metal-base substrate according to claim 10, wherein the forming of the wiring layer includes forming the wiring layer using a roll-to-roll method.

17. A method for manufacturing a semiconductor device comprising:
    placing semiconductor elements on the metal-base substrate manufactured with the method for manufacturing a metal-base substrate according to claim 10.

* * * * *